United States Patent
Lai

(10) Patent No.: US 8,252,610 B2
(45) Date of Patent: Aug. 28, 2012

(54) METHOD OF MANUFACTURING LIGHT EMITTING DIODE

(75) Inventor: Chih-Chen Lai, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 12/884,191

(22) Filed: Sep. 17, 2010

(65) Prior Publication Data

US 2011/0159616 A1 Jun. 30, 2011

(30) Foreign Application Priority Data

Dec. 30, 2009 (TW) .............................. 98145692 A

(51) Int. Cl.
*H01L 21/00* (2006.01)
(52) U.S. Cl. ............ 438/22; 438/29; 438/141; 438/514; 257/E33.034; 257/E33.001
(58) Field of Classification Search .................. 438/22, 438/29, 141, 514; 257/E33.034, E33.001
See application file for complete search history.

(56) References Cited

U.S. PATENT DOCUMENTS

| | | | | |
|---|---|---|---|---|
| 5,453,386 A | * | 9/1995 | Holm et al. ..................... | 438/34 |
| 6,255,129 B1 | * | 7/2001 | Lin ................................ | 438/26 |
| 6,278,136 B1 | * | 8/2001 | Nitta .............................. | 257/99 |
| 6,884,646 B1 | * | 4/2005 | Wu et al. ......................... | 438/22 |
| 7,364,926 B2 | * | 4/2008 | Yeh et al. ........................ | 438/22 |
| 2003/0021326 A1 | * | 1/2003 | Liao et al. ...................... | 372/96 |
| 2004/0227142 A1 | * | 11/2004 | Izumiya ......................... | 257/79 |
| 2007/0217458 A1 | * | 9/2007 | Kitano et al. .............. | 372/43.01 |

* cited by examiner

*Primary Examiner* — Julia Slutsker
(74) *Attorney, Agent, or Firm* — Altis Law Group, Inc.

(57) ABSTRACT

A method for making a light emitting diode is provided, which includes first providing a light emitting diode chip. The light emitting diode chip includes a substrate and a p-type semiconductor layer, an active layer and an n-type semiconductor layer sequentially formed on the substrate. And then sections with different resistance are formed in the n-type semiconductor layer by implanting ions into the n-type semiconductor layer in an ion implanter. Finally, an electrode pad is deposited on the n-type semiconductor layer. The electrical resistances of the sections increase following an increase of a distance from the electrode pad to the sections.

11 Claims, 9 Drawing Sheets

METHOD OF MANUFACTURING LIGHT EMITTING DIODE

TECHNICAL FIELD

The disclosure generally relates to a method for manufacturing a light emitting diode (LED) with high luminous efficiency.

DESCRIPTION OF RELATED ART

In recent years, due to excellent light quality and high luminous efficiency, light emitting diodes (LEDs) have increasingly been used to substitute for cold cathode fluorescent lamps (CCFL) as a light source of a backlight and for incandescent bulbs and compact fluorescent lamps and fluorescent tubes as a light source of an illumination device.

A typical LED generally includes a p-type semiconductor layer, an active layer, and an n-type semiconductor layer. When a voltage is applied between the p-type semiconductor layer and the n-type semiconductor layer, electrons can recombine with holes within the active layer, releasing energy in the form of photons. Currently, one challenge to LED industry is to further enhance luminous efficiency of the LED. However, due to a small size of the electrode of the LED, electric current spreading uniformly in the LED is difficult to be achieved and this results in low luminous efficiency of the LED.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

A method for manufacturing an LED in according with an embodiment of the present disclosure will now be described in detail below and with reference to the drawings.

Figure 1:
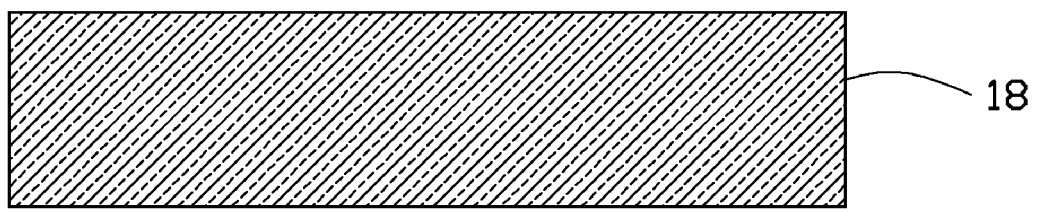
FIGS. 1 to 9 are cross-sectional views summarizing a method for making an LED in accordance with an embodiment of the present disclosure.

Referring to FIG. 1, a sapphire substrate 18 is provided.

Figure 2:
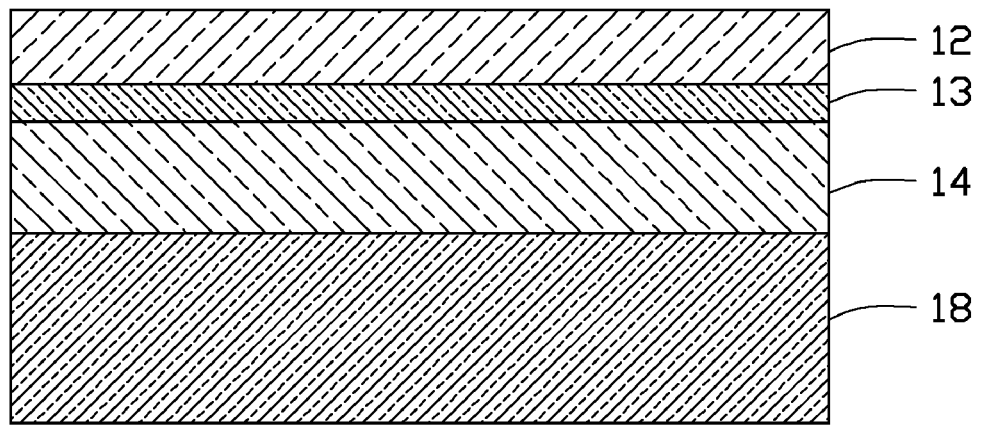

Referring to FIG. 2, an n-type semiconductor layer 14, an active layer 13 and a p-type semiconductor layer 12 are sequentially formed on the sapphire substrate 18 by processes of metal-organic chemical vapor deposition (MOCVD). The semiconductor layer can be made of GaN, AlGaN or InGaN. In this embodiment, the n-type semiconductor layer 14, the active layer 13 and the p-type semiconductor layer 12 are made of GaN.

Figure 3:
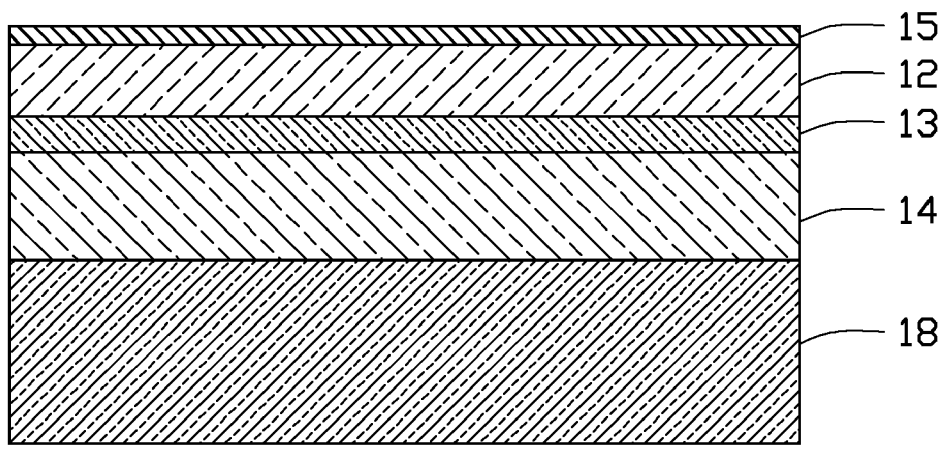

Referring to FIG. 3, a reflective layer 15 is deposited on the p-type semiconductor layer 12 for reflecting light emitted from the active layer 13 to enhance the lighting efficiency. The reflective layer 15 can be made of silver, nickel, aluminum, copper or gold. In this embodiment, the reflective layer is made of silver, which can be deposited on the p-type semiconductor layer 12 by an electron beam, sputtering, vacuum metalizing or electroplating. In alternative embodiment, a distributed bragg reflector can be formed on the p-type semiconductor layer 12.

Figure 4:
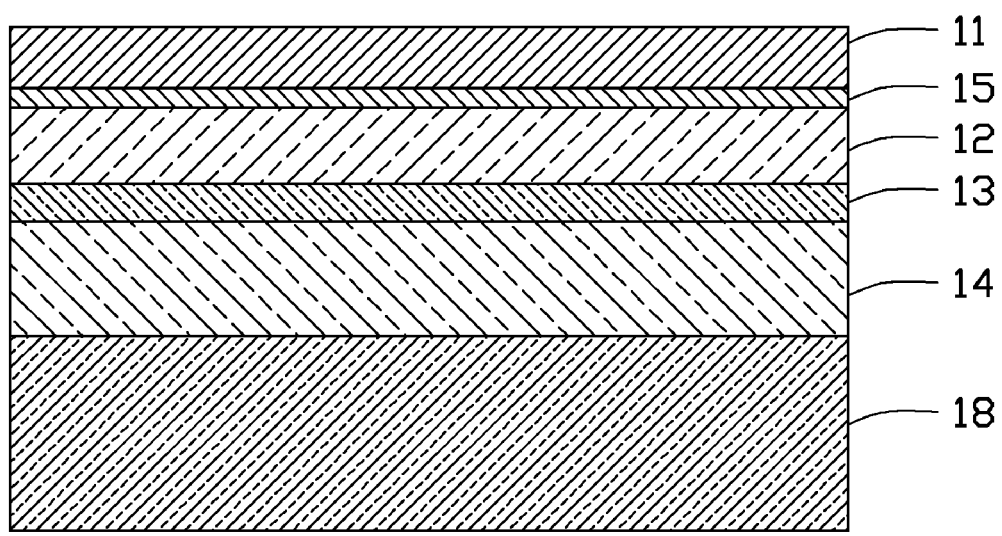

Referring to FIG. 4, a heat conductive substrate 11 is formed on the reflective layer 15. The substrate 11 can be made of copper, aluminum, nickel, silver, gold or similar alloys thereof. In addition, the substrate 11 can be a ceramic substrate or a silicon substrate or a germanium substrate. The substrate 11 is connected to the reflective layer 15 by high temperature and high pressure process. In addition, the substrate 11 can be formed by electroplating. In this embodiment, a nickel layer is electroplated on the reflective layer 15 to form the heat conductive substrate 11.

Figure 5:
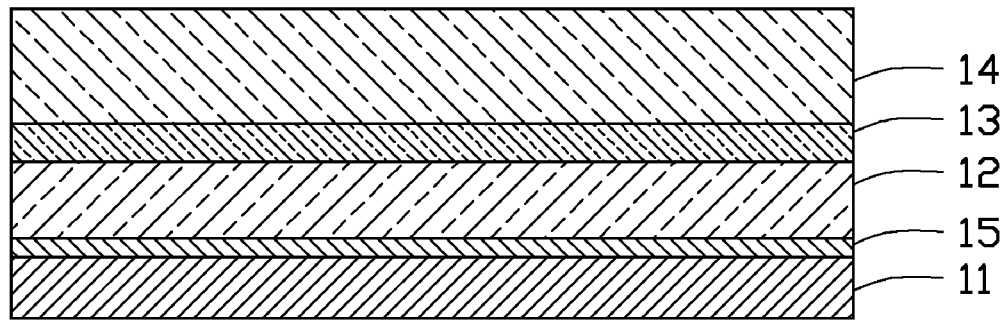

Referring to FIG. 5, the sapphire substrate 18 is removed from the n-type semiconductor layer 14. The sapphire substrate 18 can be removed by mechanical cutting, electromagnetic radiation or laser cutting. In this embodiment, the substrate 18 is removed from the n-type semiconductor layer 14 by an excimer laser. And then, a light emitting diode chip is provided, which includes the substrate 11 and the p-type semiconductor layer 12, the active layer 13 and the n-type semiconductor layer 14 sequentially formed on the substrate 11.

Figure 6:
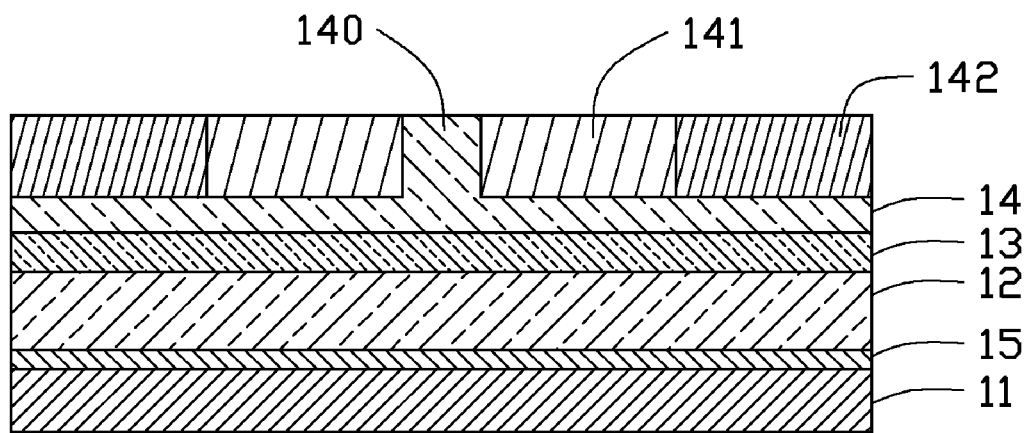

Referring to FIG. 6, sections with different resistances are formed on the n-type semiconductor layer 14 by implanting ions into the n-type semiconductor layer 14 in an ion implanter (not shown).

The ion implanter includes an ion generator, an ion extractor, an ion convertor, a mass analyzer, an accelerator, a converger and an ion measurer. Firstly, ions of boron (B), phosphorous (P) or arsenic (As) are generated in the ion generator. Secondly, the ions are then extracted by the ion extractor and converted into negative ions by the ion converter. Thirdly, the negative ions are deflected towards the accelerator by the mass analyzer. Fourthly, the velocity of ions is increased in the accelerator. Finally, the accelerated ions are converged by the converger and implanted into the n-type semiconductor layer 14 in a reaction chamber.

Figure 7:
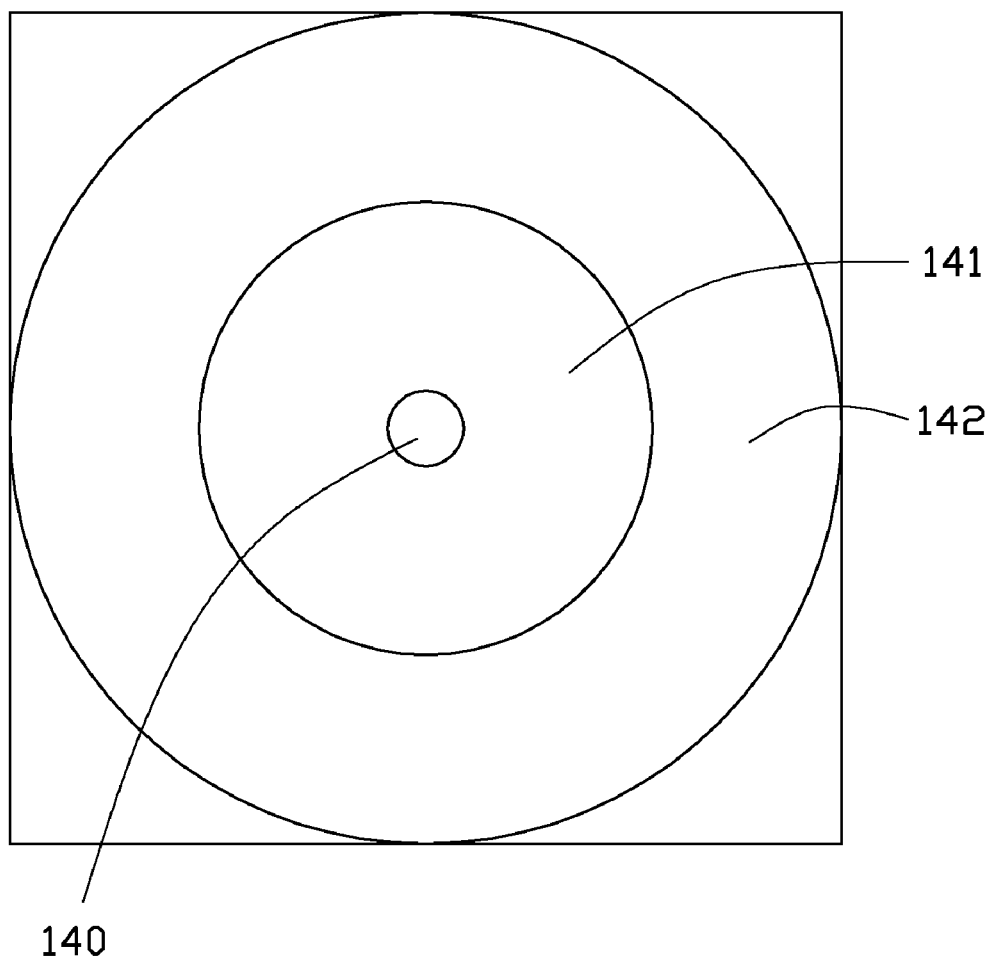

Referring to FIG. 6 and FIG. 7, in this embodiment, a non-implanting section 140 is formed at a central portion of the n-type semiconductor layer 14, and a first implanting section 141 surrounds the non-implanting section 140 and a second implanting section 142 surrounds the first implanting section 141. The first implanting section 141 and the second implanting section 142 are formed by following steps: firstly, a $SiO_2$ mask is formed to cover a top surface of the n-type semiconductor layer 14 away from the active layer 13, except for a portion thereof where the first implanting section 141 will be formed; secondly, ions are implanted into the n-type semiconductor layer 14 by an ion implanter and the first implanting section 141 is formed. The second implanting section 142 can be formed by a similar process but a concentration of ions in the first implanting section 141 is less than that in the second implanting section 142. Accordingly, the first implanting section 141 has an electrical resistance larger than that of the second implanting section 142 and smaller than that of the n-type semiconductor layer 14 which is the same as that of the non-implanting section 140. When a voltage is applied to the LED, current will first flow from the first implanting section 141 to the second implanting section 142. Current crowding in a centre of the LED can be avoided and a uniform current distribution flowing thorough the n-type semiconductor layer 14 is obtained. In this embodiment, thicknesses of the first implanting section 141 and the second implanting section 142 are controlled by an implanting time. Generally, the thicknesses of the first implanting section 141 and the second implanting section 142 are less than the thickness of the n-type semiconductor layer 14 to avoid implanting the ions into the active layer 13. For the n-type semiconductor layer 14 having a thickness of 3 μm, the thicknesses of the first implanting section 141 and the second implanting section 142 are in the range from 2 μm to 2.5 μm. Concentrations of ions in the first implanting section 141 and the second implanting section 142 are in range from $1\times10^{18}$ cm$^{-3}$ to $9\times10^{18}$ cm$^{-3}$.

In alternative embodiments, the n-type semiconductor layer 14 can be divided into three, four or more implanting sections for an even better current distribution.

Figure 8:
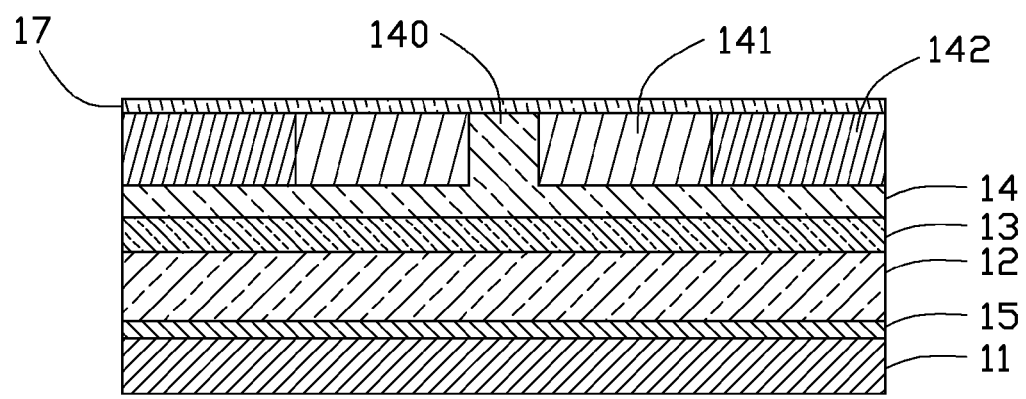

Referring to FIG. 8, a transparent electrode layer 17 is deposited on the surface of 140, 141, 142, which can further increase the distribution of current. The transparent electrode layer 17 is made of indium tin oxide (ITO).

Figure 9:
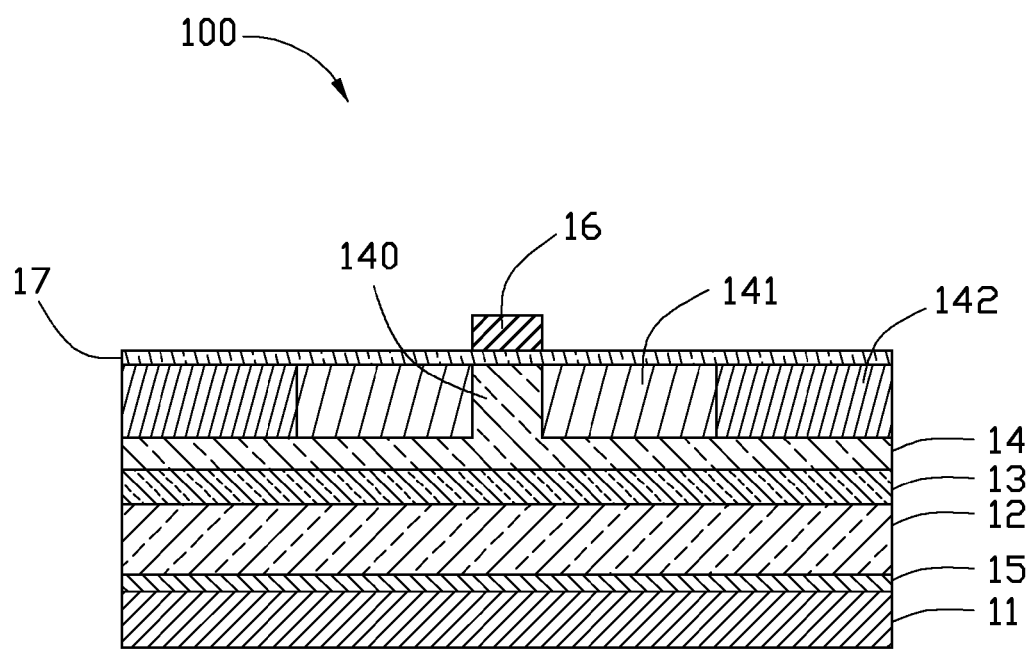

Referring to FIG. 9, an electrode pad 16 is formed on the transparent electrode layer 17 for connecting to a power supply. In this embodiment, the electrode pad 16 is positioned on the non-implanting section at the centre of the n-type semiconductor layer 14. The electrode pad 16 is made of silver, which can be deposited on the transparent layer 17 by an electron beam, sputtering, vacuum metalizing or electroplating.

In one alternative embodiment, the electrode pad 16 can also be formed on the edge of the n-type semiconductor layer 14. Accordingly, the positions of the first implanting section 141 and the second implanting section 142 need to exchange so that an electrical resistance of an implanting section adjacent to the electrode pad 16 is greater than that of an other implanting section distant from the electrode pad 16.

It is to be understood, however, that even though numerous characteristics and advantages of certain inventive embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. A method for manufacturing a light emitting diode, comprising:
   providing a light emitting diode chip comprising a p-type semiconductor layer, an active layer and an n-type semiconductor layer sequentially laminated;
   implanting ions into the n-type semiconductor layer to form a non-implanting section in a central portion of the n-type semiconductor layer, a first implanting section encircling the non-implanting section, and a second implanting section encircling the first implanting section, an electrical resistance of the n-type semiconductor layer decreasing outwards from the non-implanting section to the second implanting section; and
   depositing an electrode pad on the non-implanting section.

2. The method of claim 1, wherein a thickness of the first implanting section and the second implanting section is less than a thickness of the n-type semiconductor layer.

3. The method of claim 1, wherein the ions implanted into the n-type semiconductor layer are selected from groups consisting of boron, phosphorous and arsenic.

4. The method of claim 1, wherein concentrations of the ions in the first implanting section and the second implanting section are in range of $1\times10^{18}$ cm$^3$ to $9\times10^8$ cm$^3$.

5. The method of claim 1, wherein a transparent conductive layer is formed on the n-type semiconductor layer before the electrode pad is deposited.

6. The method of claim 1, wherein the light emitting diode chip is provided by following steps:
   providing a sapphire substrate;
   sequentially forming the n-type semiconductor layer, the active layer and the p-type semiconductor layer on the sapphire substrate;
   attaching a heat conductive substrate on the p-type semiconductor layer; and
   removing the sapphire substrate.

7. The method of claim 6, wherein the heat conductive substrate is made by electroplating nickel on the p-type semiconductor layer.

8. The method of claim 6, wherein the sapphire substrate is removed by mechanical cutting, electromagnetic radiation or laser cutting.

9. The method of claim 6, further comprising a step of depositing a reflective layer on the p-type semiconductor layer before attaching the heat conductive substrate on the p-type semiconductor layer.

10. The method of claim 9, wherein the reflective layer is made of silver, nickel, aluminum, copper or gold.

11. The method of claim 9, wherein the reflective layer is deposited on the p-type semiconductor layer by an electron beam, sputtering, vacuum metalizing or electroplating.

* * * * *